(12) United States Patent
Schinner et al.

(10) Patent No.: US 8,203,168 B2
(45) Date of Patent: Jun. 19, 2012

(54) INTEGRATION OF SMD COMPONENTS IN AN IC HOUSING

(75) Inventors: Felix Schinner, Emmendingen (DE);
Christian Joos, Ehrenkirchen (DE);
Wolfgang Hauser, Endingen (DE);
Michael Schmidt, Steinach (DE);
Thomas Burke, Freiburg (DE)

(73) Assignee: Micronas GmbH, Freiburg (DE)

( * ) Notice: Subject to any disclaimer, the term of this patent is extended or adjusted under 35 U.S.C. 154(b) by 153 days.

(21) Appl. No.: 12/888,174

(22) Filed: Sep. 22, 2010

(65) Prior Publication Data
US 2011/0068460 A1 Mar. 24, 2011

(30) Foreign Application Priority Data
Sep. 22, 2009 (EP) .................................... 09012018

(51) Int. Cl.
*H01L 33/00* (2010.01)
(52) U.S. Cl. ................... 257/99; 257/690; 257/E33.056
(58) Field of Classification Search .................... 257/99, 257/678, 690, 692, 711, 724, E33.056
See application file for complete search history.

(56) References Cited

U.S. PATENT DOCUMENTS
2010/0072510 A1* 3/2010 Lin et al. .......................... 257/99

FOREIGN PATENT DOCUMENTS
DE 197 14 385 A1 10/1998
JP 2004-241579 8/2004
* cited by examiner

*Primary Examiner* — Hoai V Pham
(74) *Attorney, Agent, or Firm* — Muncy, Geissler, Olds & Lowe, PLLC

(57) ABSTRACT

The invention relates to an electronic component having a semiconductor component, particularly a semiconductor chip, and at least one SMD component, a chip carrier with a support platform and with connecting leads. Whereby the semiconductor component, which is connected electrically via chip bonds to bond fingers of the connecting leads is mounted on the support platform and the SMD component connects the support platform to a connecting lead via contact surfaces arranged thereon, a housing, which encloses the semiconductor component, the SMD component, and at least partially the chip carrier. The support platform and the connecting lead in the area of the SMD component are profiled to create barriers in such a way that flowing of a free-flowing material from the contact surfaces connected to the SMD component of the chip carrier both onto the support platform and onto the connecting lead is prevented.

14 Claims, 3 Drawing Sheets

INTEGRATION OF SMD COMPONENTS IN AN IC HOUSING

This nonprovisional application claims priority under 35 U.S.C. §119(a) to Euorpean Patent Application No. EP 09012018.9, which was filed on Sep. 22, 2009, and which is herein incorporated by reference.

BACKGROUND OF THE INVENTION

1. Field of the Invention

The invention relates to an electronic component.

2. Description of the Background Art

An electronic component of this type is disclosed in JP2004241579 A. This electronic component comprises a semiconductor chip, mounted on a support platform of a lead frame, and a capacitor formed as an SMD component, which is arranged between the support platform, used as the ground terminal, and a connecting lead for supplying an operating voltage. To form a housing, the semiconductor chip and the SMD component as well are molded with a molding compound.

The mounting of such an SMD component on the lead frame occurs by means of an adhesive bond with an epoxy base, whereby an electrically conducting connection is produced by means of additives. It is a disadvantage here, however, that bleeding (epoxy bleeding) of the adhesive occurs, so that as a result the adhesive can spread uncontrolled to the bond fingers and bondability is therefore no longer assured.

To resolve this problem, DE 197 14 385 A1 proposes a method for limiting the bleeding of the adhesive, particularly during mounting of electronic components in a COB (chip on board) design, according to which by a method-related application of an obstacle, a self-contained barrier is formed by the use of suitable lacquers, e.g., of a solder resist. In this prior-art method, this barrier is placed as a closed ring in the gap between the mounting surface of a semiconductor chip and the associated bond pad.

The disadvantage of this prior-art method is not only the additional cost of producing an appropriate solder resist mask but also the additional process steps. Depending on the type of solder resist used, after application to the chip carrier it must be cured or dried, exposed to light, and developed.

SUMMARY OF THE INVENTION

It is therefore an object of the present invention to provide an electronic component of the aforementioned type, in which bleeding of the adhesive is effectively prevented by means of simple measures, without the disadvantages of the prior-art method.

In an electronic component of this type, according to the invention, in the area of the SMD component, the support platform and the connecting lead to create barriers are profiled in such a way that flowing of a free-flowing material from the contact surfaces, connected to the SMD structural element, of the chip carrier onto the support platform and onto the connecting lead is prevented.

These barriers represent an effective separator for the free-flowing material from the chip carrier contact surfaces contacted by the SMD component. Further, the electronic component of the invention is notable particularly in that the fabrication process in the backend need not be changed, rather the chip carrier (metal grid, lead frame) used in the backend process already has the mechanical barriers, which are formed preferably as trenches or elevations and can be produced by simple embossing on the chip carrier or the lead frame during the manufacturing process thereof, as a result of which particularly the area requirement for this type of barriers is very low. Overall, compared with the prior-art method, these advantages result in cost saving, both with respect to material and tool costs and with respect to shorter process times.

In an embodiment of the invention, the barriers are arranged transverse to the flow direction of the free-flowing material, as a result of which optimal orientation with respect to their function is assured.

It is advantageously, when according to an embodiment of the invention, the barriers run linearly between opposing edge areas of the support platform or the connecting leads in such a way that the contact surfaces are separated from the other area of the support platform or the connecting lead. No curvilinear barriers are therefore needed, as a result of which simple tools can be used, for example, for the creation of the barriers by embossing processes.

According to an embodiment of the invention, to form the contact surface connected to the SMD component, the support platform has at least one nose element, whereby the barrier is profiled in such a way in the support platform that the nose element in the transition region to the support platform is separated from the same. In this way, this nose element, which is the contact surface for the SMD component, can be separated in an especially simple way from the other area of the support platform by a linear barrier.

The support platform can be formed with a number of such nose elements, each of which has a contact surface and is connected via an SMD component to a connecting lead, the associated barriers on the support platform being produced as a continuous structure. A barrier, which extends linearly along the transition region of these nose elements on the support platform and serves simultaneously as a barrier for all contact surfaces on the nose elements, can thereby be produced with one tool.

A connecting lead can be formed on the support platform between two such nose elements, having contact surfaces for SMD components, in such a way that in the area of the nose elements a predefined distance to the nose elements is maintained. The barriers assigned to the contact surfaces of the two nose elements are thereby connected linearly via said connecting lead, so that it can be advantageously produced as a single barrier. This type of connecting lead generally has the same potential as the semiconductor component and is used as the ground terminal. This results in large degrees of freedom with respect to the design of the chip carrier or the lead frame with the associated barriers.

An embodiment of the invention results from the formation of at least one connecting lead with a contact surface, connected to the SMD component, and with a bond finger in such a way that the bond finger extends in the direction of the connecting lead and the contact surface for this is formed substantially at right angles to the connecting lead. As a result, the area on the connecting lead, which is in contact with at least one bond wire, is separated geometrically from the area on the connecting lead forming the contact surface for the SMD component, so that this also prevents free-flowing material, for example, the adhesive, from flowing under the SMD component into the bond finger.

In another embodiment of the invention, the connecting leads within the housing are profiled in the edge area thereof to create additional barriers, to prevent the entry of moisture from outside over these connecting leads. Preferably, the additional barriers on the connecting leads extend parallel to the lateral surface of the housing from which the connecting leads emerge from the housing.

Furthermore, according to an embodiment of the invention, it is advantageous when the support platform has at least one formed nose element, projecting from a housing surface of the housing, and this nose element is profiled to create a barrier running within the housing, whereby this barrier extends parallel to the housing surface from which the nose element projects. This nose element is used to support the support platform during the housing manufacturing process.

Finally, according to an embodiment of the invention, it is cost-effective to produce the barriers formed as trenches and/or as elevations by embossing the support platform and the connecting leads by means of an embossing tool during the production of the chip carrier or of the lead frame, whereby preferably the trenches are formed with a V-shaped cross section.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
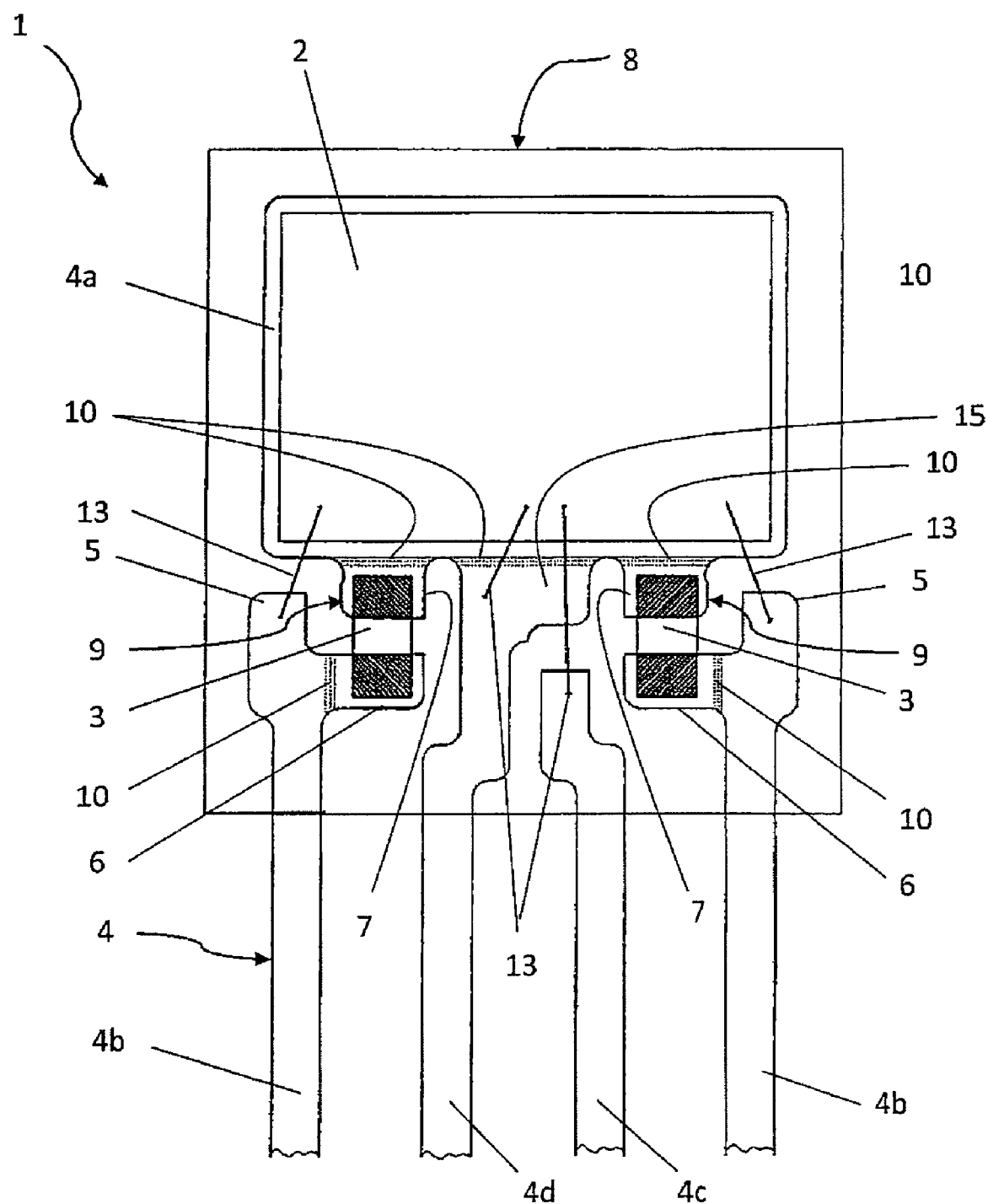
FIG. 1 shows a schematic illustration in a top plan view of an exemplary embodiment of an electronic component of the invention.

The electronic component 1 according to FIG. 1 comprises a semiconductor chip 2, mounted on a support platform 4a of a chip carrier (lead frame) 4, and two passive SMD components 3, for example, two capacitors.

The rectangular support platform 4a has on one side of the rectangle two rectangular nose elements 9, which are formed on support platform 4a and in each case form a contact surface 7 for a connecting end of one of the SMD components 3. The other connecting ends of the SMD components 3 in each case contact a connecting surface 6, which is formed as a rectangular part of a connecting lead (lead finger) 4b of chip carrier 4. The end of a connecting lead 4b, adjacent to support platform 4a, forms a bond finger 5, whereby connecting surface 6 and said bond finger 5 are at right angles to one another. Semiconductor chip 2 is connected via bond wires 13 to bond fingers 5 of both connecting leads 4b.

The two SMD components 3 are connected electrically by means of a conductive adhesive with an epoxy resin base to the two contact surfaces 6 and 7. To prevent bleeding of this adhesive from said contact surfaces 6 and 7 in the direction of support platform 4a and in the direction of connecting leads 4b, particularly in the direction of bond fingers 5, barriers 10 are embossed in the material of connecting leads 4b and support platform 4a.

Said barriers 10 are formed as trenches or channels with a V-shaped cross section and separate contact surfaces 6 and 7 from the other areas of connecting lead 4b or support platform 4a, in that these barriers connect the opposite edges of contact surfaces 6 or nose elements 9 linearly. These barriers 10 thereby represent an effective separator for the free-flowing material from contact surfaces 6 and 7 of chip carrier 4 contacted by the two SMD components 3.

In addition, the risk of bleeding (epoxy bleeding) is reduced also in that bond fingers 5 of connecting leads 4b and contact surfaces 6 thereof are geometrically offset to one another, therefore are placed "diagonally," as is evident from FIG. 1 and has already been described above.

According to FIG. 1, between the two nose elements 9 another connecting lead 4d is provided, which is formed via a nose element 15 as a transition part on support platform 4a and serves as a bond finger for the ground terminal, whereby this bond finger is connected via a bond wire 13 to semiconductor chip 2. The ground connection between nose element 15 and semiconductor chip 2, however, instead of via bond wire 13, can occur equally well by an electrical back connection of semiconductor chip 2 via a conductive adhesive; i.e., semiconductor chip 2 is then glued with its back onto chip carrier 4. Hereby barriers 10, separating nose elements 9 from support platform 4a, are connected linearly via this transition part 15, so that this nose element 15 as well is separated from support platform 4a. The gap between nose elements 7 and 15 are formed as slits and end in a semicircle in the area of barrier 10. Thereby, the bond finger of nose element 15 associated with connecting lead 4d is also protected from a bleeding adhesive from contact surfaces 7.

Finally, FIG. 1 shows another connecting lead 4c, which within housing 8 has a bond finger, which is connected via a bond wire to semiconductor chip 2.

Figure 3:
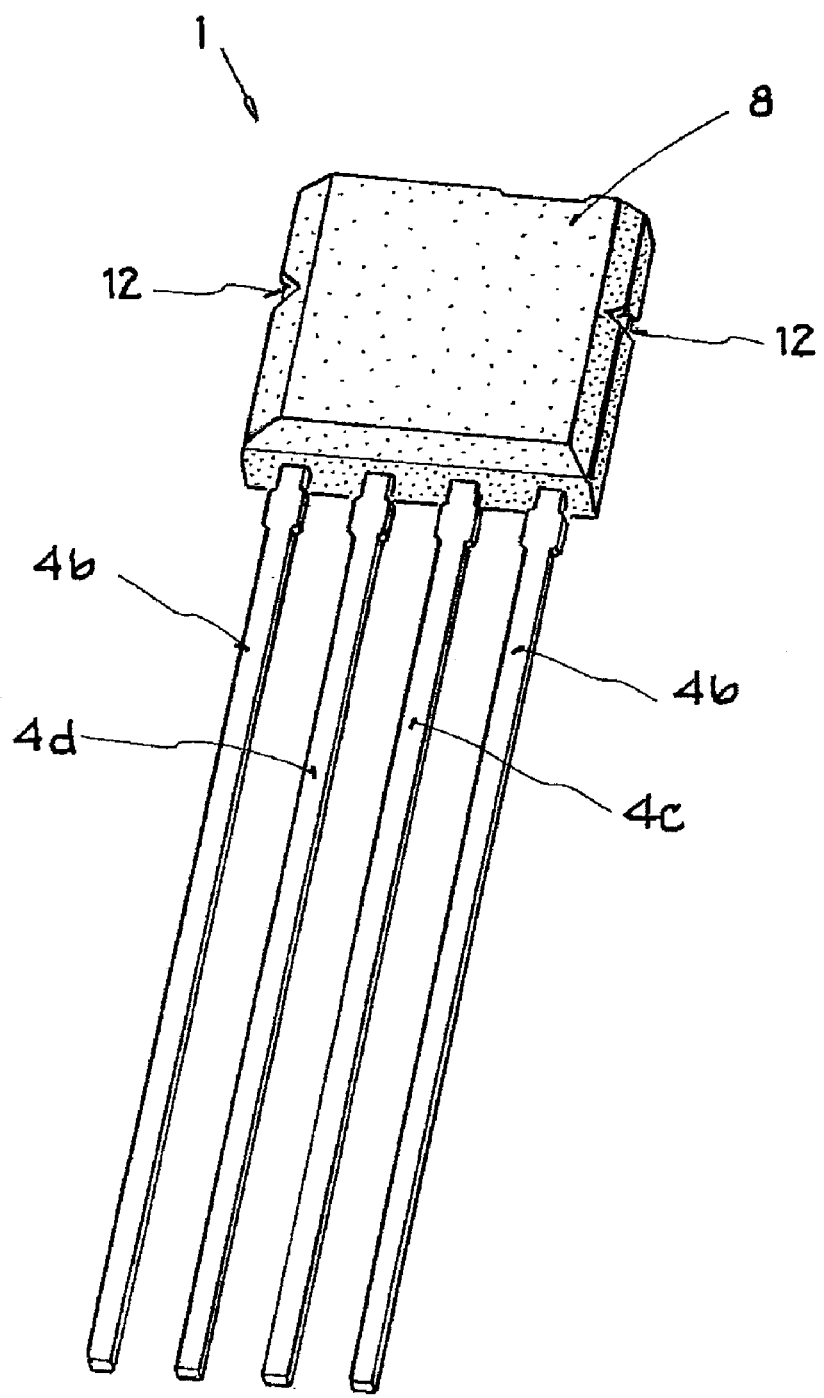
FIG. 3 shows a perspective illustration of the electronic component of the invention according to FIG. 2.

The housing 8 fabricated by means of a molding compound in a molding process integrates both the active semiconductor component 2 and the passive SMD component 3 in a THD housing, as is shown, for example, in principle in FIG. 3.

Figure 2:
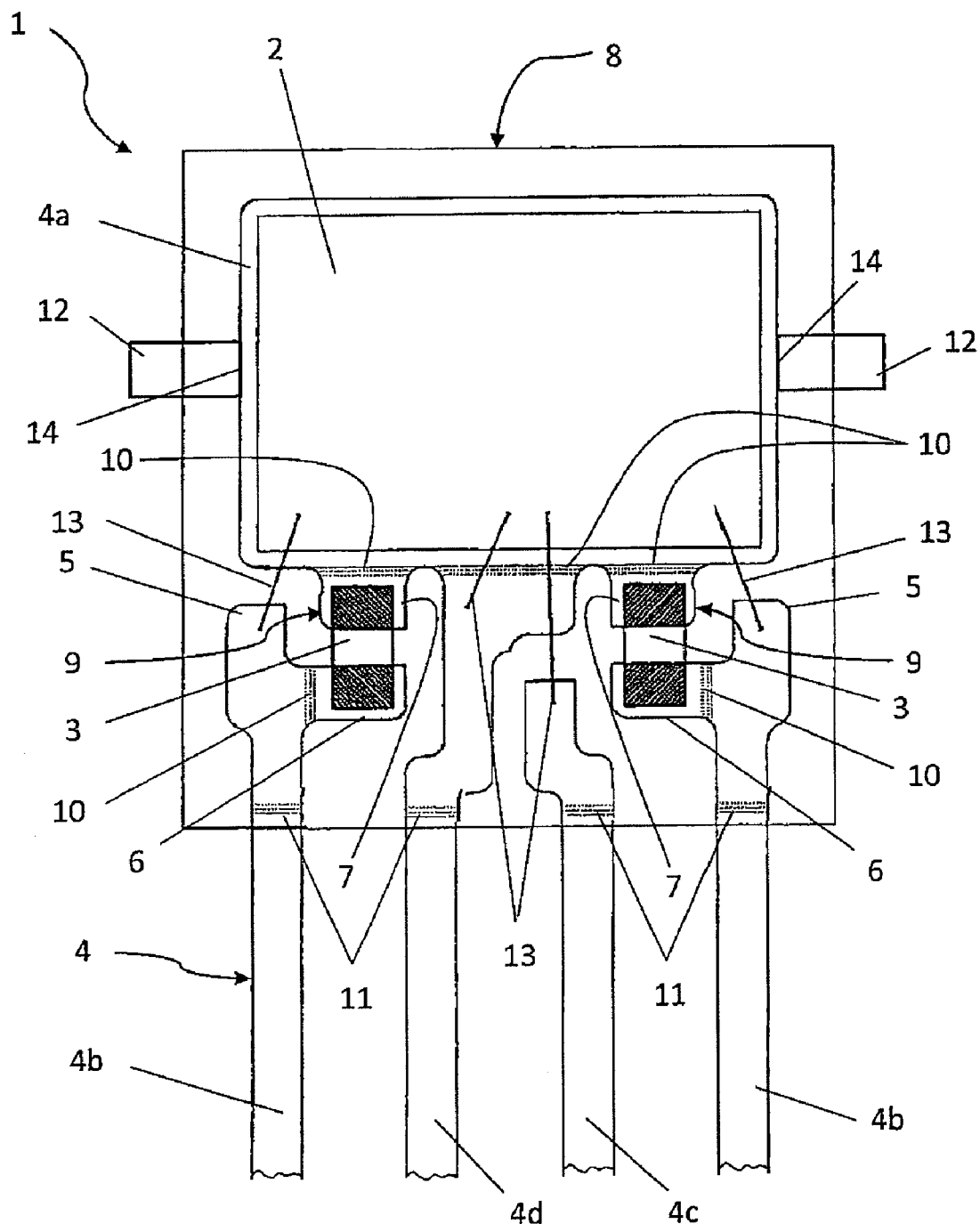
FIG. 2 shows a schematic illustration in a top plan view of another exemplary embodiment of an electronic component of the invention.

Electronic component 1 according to FIG. 2 differs from that according to FIG. 1 only in that on support platform 4a on opposite sides in each case additional nose elements 12 are formed, which project from housing 8 and serve to support the support platform 4a by a molding tool during the molding process of housing 8, in order to prevent tipping of support platform 4a during the molding process.

Another difference in regard to the embodiment of FIG. 1 is that the chip carrier (lead frame) 4 according to FIG. 2 has additional barriers 11 and 14, which are impressed as trenches with a V-shaped cross section into the material of chip carrier 4.

Thus, barriers 11 are arranged in the edge area within housing 8 on connecting leads (lead fingers) 4b, 4c, and 4d transverse to the longitudinal direction thereof, therefore parallel to the edge of housing 8. Barriers 14 are also arranged within housing 8 such that they separate nose elements 12 from support platform 4a. Said barriers 11 and 14 function to prevent the penetration of moisture into housing 8.

FIG. 3 shows in a perspective view the molded electronic component 1, which integrates both active semiconductor component 2 and SMD component 3 in housing 8. In particular, the two nose elements 12 projecting from housing 8 can be seen in this FIG. 3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An electronic component comprising:
   a semiconductor chip;
   an SMD component; and
   a chip carrier having a support platform and connecting leads, the semiconductor chip being configured to be mounted on the support platform and being configured to be electrically connectable via chip bonds to bond fingers of connecting leads,
   wherein the SMD component connects the support platform to a connecting lead via the contact surfaces arranged on the support platform and the connecting lead,
   wherein a barrier is formed on the support platform and on the connecting lead in an area of the SMD component by profiling to prevent flowing of a free-flowing material from the contact surfaces, and
   wherein the barriers run linearly between opposing edge areas of the support platform or the connecting lead in such a way that the contact surfaces are separated from the remaining area of the support platform or the connecting lead.

2. The electronic component according to claim 1, wherein the barriers are arranged transverse to the flow direction of the free-flowing material.

3. The electronic component according to claim 1, wherein a housing is provided, which surrounds the semiconductor component, the SMD component, and at least in part the chip carrier.

4. The electronic component according to claim 1, wherein, to form the contact surface connected to the SMD component of the support platform, the same has at least one nose element, wherein the barrier is profiled in such a way in the support platform that the nose element in the transition region to the support platform is separated from the same.

5. The electronic component according to claim 4, wherein the support platform has a number of nose elements, each of which has a contact surface and is connected via an SMD component to a connecting lead, and wherein the associated barriers on the support platform are connectable to one another.

6. The electronic component according to claim 5, wherein between two nose elements, to connect with an SMD component in each case, a connecting lead is formed on the support platform such that in an area of the nose elements a predefined distance to the nose elements (9) is maintained.

7. The electronic component according to claim 1, wherein at least one connecting lead is formed with a contact surface connected to the SMD component and with a bond finger such that the bond finger extends in a direction of the connecting lead and the contact surface and is formed substantially at right angles to the connecting lead.

8. The electronic component according to claim 1, wherein the connecting leads within the housing are profiled in an edge area thereof to create additional barriers.

9. The electronic component according to claim 8, wherein the connecting leads are profiled such that the additional barriers on the connecting leads extend substantially parallel to a lateral surface of the housing from which the connecting leads emerge from the housing.

10. The electronic component according to claim 1, wherein the support platform has at least one formed nose element projecting from a housing surface of the housing and said nose element is profiled to create a barrier running within the housing, and wherein this barrier extends substantially parallel to the housing surface from which the nose element projects.

11. The electronic component according to claim 1, wherein the barriers are formed as a trench or as an elevation.

12. The electronic component according to claim 11, wherein the barriers formed as trenches or as elevations are created by embossing the support platform and the connecting leads.

13. The electronic component according to claim 11, wherein the trench depth of the barriers formed as trenches is 1/10 the thickness of the chip carrier.

14. The electronic component according to claim 1, wherein the barriers formed as trenches or as elevations have a V-shaped cross section.

* * * * *